United States Patent [19]
Cheselske

[11] Patent Number: 5,121,311
[45] Date of Patent: Jun. 9, 1992

[54] HINGED LED HOLDER

[75] Inventor: David A. Cheselske, Upland, Calif.

[73] Assignee: R & D Molded Products, Inc., San Dimas, Calif.

[21] Appl. No.: 639,575

[22] Filed: Jan. 9, 1991

[51] Int. Cl.$^5$ ............................................ F21V 21/00
[52] U.S. Cl. .................................... 362/249; 362/240; 362/374; 362/800; 439/56
[58] Field of Search ............... 362/240, 249, 250, 368, 362/374, 375, 455, 800, 226; 439/56, 57

[56] References Cited

U.S. PATENT DOCUMENTS

| | | | |
|---|---|---|---|
| 4,065,198 | 12/1977 | Jordan | 439/56 |
| 4,206,493 | 6/1980 | Towne et al. | 362/240 |
| 4,575,785 | 3/1986 | Lerude et al. | 362/800 |
| 4,631,650 | 12/1986 | Ahroni | 362/249 |
| 4,803,599 | 2/1989 | Trine et al. | 362/249 |
| 4,897,769 | 1/1990 | Lang | 362/800 |

Primary Examiner—Ira S. Lazarus
Assistant Examiner—Sue Hagarman
Attorney, Agent, or Firm—Christie, Parker & Hale

[57] ABSTRACT

An LED holder uses two pivotably connected portions to mount an upper and a lower LED on a printed circuit board. The first portion has a pair of receptacles for holding the bodies of the LEDs, and a pair of bores extending from the bottom of each receptacle. The second portion has a pair of bores for receiving the leads of the top LED when the second portion is in an open position with respect to the first portion. Pivoting the second portion toward the first portion bends the leads of the top LED between the bores, and brings a guide surface to bear on the leads of the bottom LED, bending the bottom LED leads. Further pivoting the second portion latches it into place against the first portion, and holds the bent leads in position for connecting to a printed circuit board.

30 Claims, 5 Drawing Sheets

HINGED LED HOLDER

FIELD OF THE INVENTION

The present invention pertains to the field of LED holders, and in particular, to an LED holder for supporting an LED on a surface which allows the LED to be mounted and the wires to be bent by closing a hinged portion of the holder against a main body.

BACKGROUND OF THE INVENTION

Light-emitting diodes (LEDs) are commonly mounted directly to circuit boards to display information about the operation of a circuit. A typical LED will have a cylindrical transparent housing which is dome-shaped at one end of the cylinder and flat at the other. The two leads which drive the LED typically extend from the flat end. Such an LED can be mounted in a molded holder, constructed specifically for that purpose. A typical holder supports the LED so that the cylindrical LED axis is parallel to the plane of the printed circuit board. The LED is inserted into the holder by guiding the leads into holes on the bottom of an LED receptacle in the holder, and then bending the leads to extend at a right angle into the circuit board. The plastic holder provides a bottom wall for resting on the board and a receptacle in a definite location with respect to the bottom. Such an LED holder is shown, for example, in U.S. Pat. No. 4,667,277 to Hanchar. A typical holder will have grooves into which the LED's leads are to be bent manually. This is best done using a special tool, however, it can also be done more slowly by hand. The grooves provided in a typical holder do not precisely locate the LED leads, making it difficult to feed them into holes in the printed circuit board, and do not securely hold the LEDs in a specific position.

SUMMARY OF THE INVENTION

The present invention provides an LED holder which can quickly and reliably bend the leads of two or more LEDs simultaneously, precisely positioning the LEDs and reliably retaining the bent leads in specific positions along the bottom surface of the holder. The leads are positioned more consistently and more quickly than with a conventional holder, without the use of special tools.

In one embodiment, the invention encompasses a holder for supporting an LED with a wire lead on a surface. The holder has a first portion with a bottom wall for supporting the holder on the surface, and a side wall with a receptacle for receiving an LED. There is a second side wall, opposite the first side wall, and a bore between the receptacle and the second side wall for receiving the lead and allowing the lead to extend past the second side wall. A second portion is pivotably connected to the first portion, and has a bearing surface for engaging the extending lead and bending it to extend substantially perpendicular to the first portion's bottom surface. The second portion bends the lead as it is pivoted toward the first section.

In another embodiment, the invention encompasses a method for mounting an LED having a wire lead in an LED holder for supporting the LED on a surface. The method involves inserting the LED lead into an LED receptacle on a first portion of the holder and through a bore in the holder to extend past the end of the bore until the LED seats in the receptacle. Then, a bearing surface of a second portion of the LED holder is pivoted toward the extending lead to bend the lead with respect to the bore. The second portion is then pivoted further until it is engaged by a latch, and the engaged second portion substantially holds the lead in place.

BRIEF DESCRIPTION OF THE DRAWINGS

These and other aspects of the invention will be more fully understood by referring to the following detailed description and accompanying drawings wherein.

DETAILED DESCRIPTION OF THE INVENTION

Figure 1:
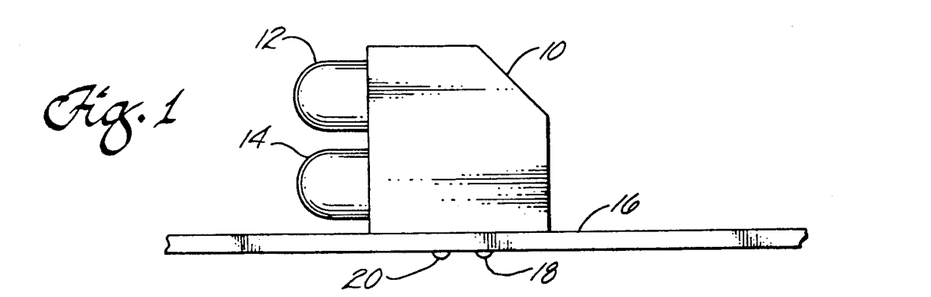
FIG. 1 is a side elevation view of an LED holder, according to the present invention, containing LEDs soldered to a printed circuit board.

Referring to FIG. 1, an LED holder 10 allows a pair of LEDs 12, 14 to be reliably and securely mounted to a printed circuit board 16. The present invention will be described as a holder for two LEDs. However, it can easily be adapted to hold more or fewer LEDs. Currently, a holder for two LEDs in which the LEDs are stacked vertically, with an upper LED 12 and a lower LED 14, is preferred. Larger arrays are constructed by locating the holders beside other holders so that rows of LEDs can be provided. Each LED has a pair of leads 18, 20 which conduct current through the LED to induce it to emit light. These leads extend through the printed circuit board, and are soldered in place to hold the holder and LEDs in place.

Figure 2:
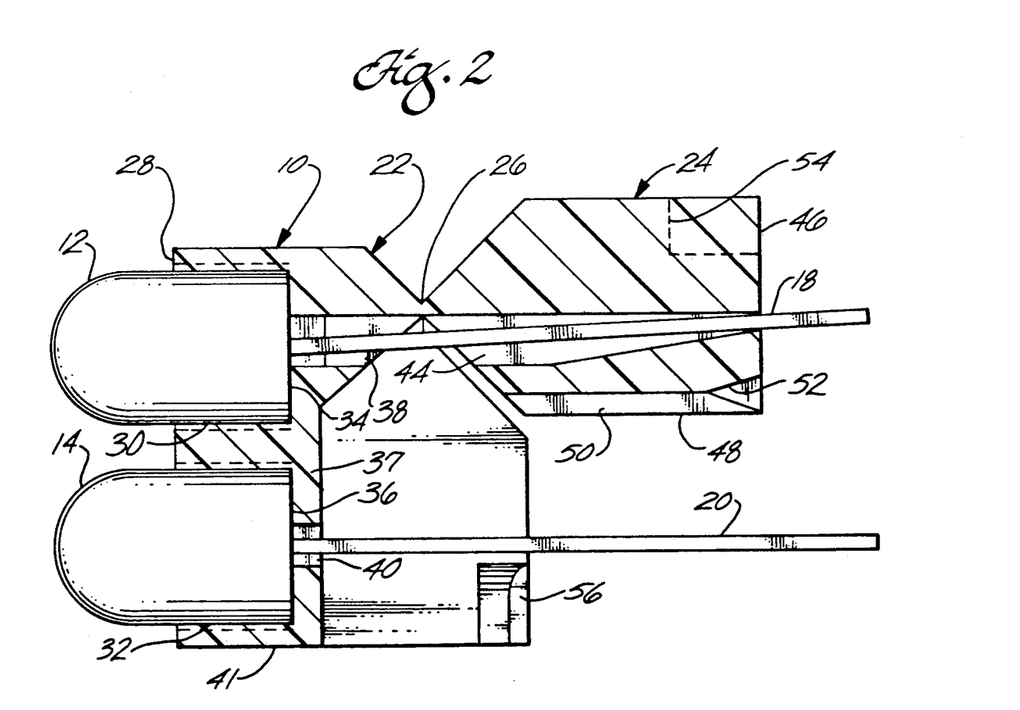
FIG. 2 is a cross-sectional view of the LED holder of FIG. 1 in an open position containing LEDs.

Referring to FIG. 2, the LED holder is constructed from a first portion 22 and a second portion 24. The two portions are preferably molded as a single integral unit from a flexible, electrically nonconducting thermoplastic, and connected by an integrally molded hinge 26. The plastic material is preferably selected so that the hinge may be operated at least once without breaking.

Figure 7:
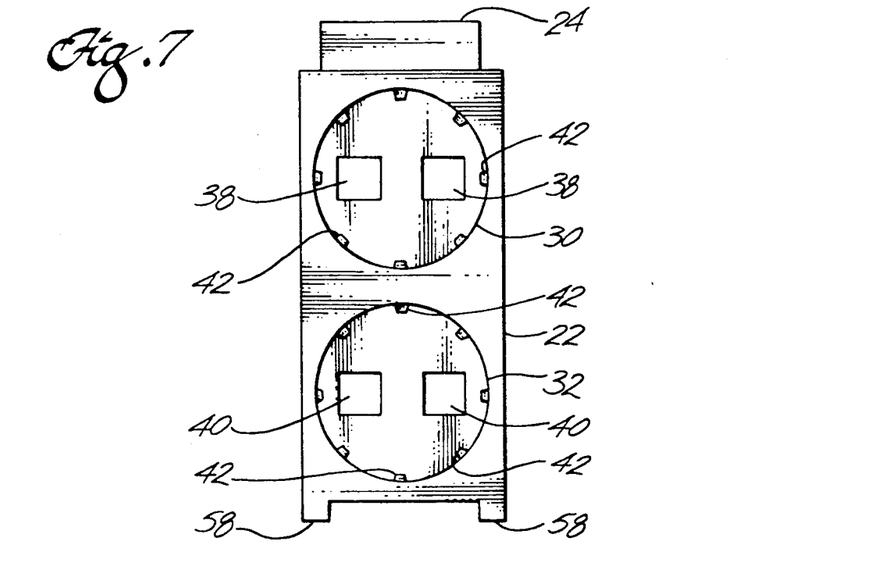
FIG. 7 is a front view of the holder of FIG. 2 in an open position showing the receptacles of the holder of FIG. 2.

The first portion has a first side wall 28 in its front surface, with two LED receptacles 30, 32 which are each adapted to receive an LED. LEDs are typically available in standard sizes, so the LED holder can be constructed to have receptacles which substantially match the exterior of a standard size LED. In the present embodiment, the LEDs have a cylindrical body with a flat end from which the leads extend and an opposite domed end. Accordingly, the receptacles 20, 32 have a matching cylindrical cross section (FIG. 7). The size and shape of the receptacles can be altered to receive any standard LED. The receptacles have a round bottom surface 34, 36 against which the LEDs seat when they are fully inserted into the receptacles. The first portion has a second side wall 37 opposite the first wide wall 28. A pair of bores 38, 40 extend from the bottom of each seat through the second side wall. When an LED is seated within a receptacle, its leads extend through the bores and through the second side wall. A set of ribs 42 (FIG. 7) extending axially along the receptacle walls help to secure the LEDs in place when they have been seated in the receptacles. A bottom wall 41 extends between the first and second side walls for supporting the holder on a printed circuit board.

Figure 4:
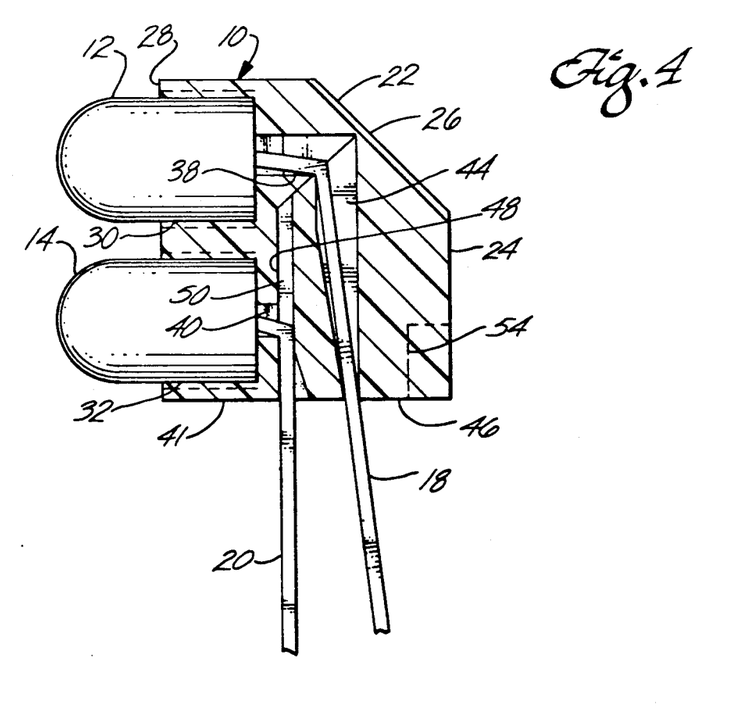
FIG. 4 is a cross-sectional view of the LED holder of FIG. 2 in the closed position and containing LEDs.

The second portion 24 also includes a pair of bores 44 which receive the leads 18 from the upper LED 12. The second portion is pivotably connected through the hinge to the first portion so that it can pivot from an open position, as shown in FIG. 2, to a closed position, as shown in FIG. 4. When the second portion is in the fully open position, the bores 44 in the second portion are aligned with the bores 38 for the top LED in the first portion. This allows the straight leads of the LED to be inserted directly into the receptacle, then through the bores in the first portion, and straight through into the second bores 44 in the second portion of the LED holder to extend through the opposite end of the second portion. The second portion has a bottom wall 46 opposite the bores in the first portion through which the LED leads extend when the top LED is seated in the receptacle. The bores in the second portion have a relatively large cross-sectional area adjacent the bores in the first portion to allow the leads to easily be inserted into the second bores from the first bores. At the bottom wall 46, however, the bores narrow substantially. When the second portion is closed against the second wall of the first portion, the top LED's leads extend through this narrow hole in the bottom surface of the second portion. Keeping the holes small, i.e., maintaining a small cross-sectional area for the bores, precisely positions the leads so that they can more easily be inserted into the corresponding holes in the printed circuit board.

Figure 3:
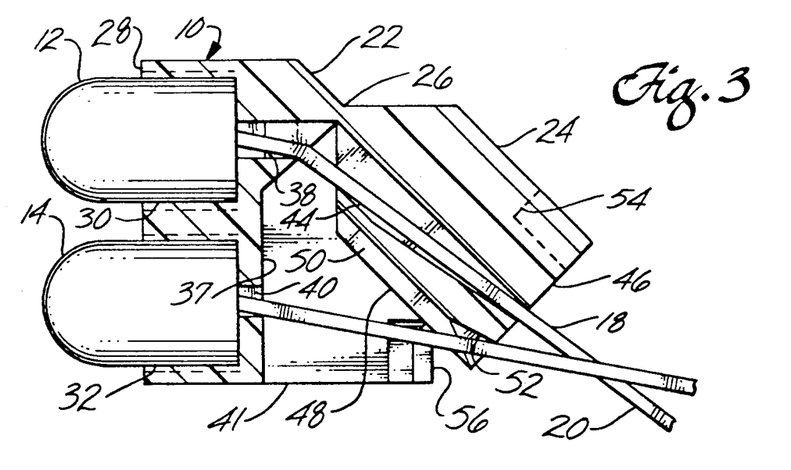
FIG. 3 is a cross-sectional view of the LED holder of FIG. 2 in a partially closed position containing LEDs.

The second portion also has a side wall or guide wall 48 with a pair of grooves 50. These grooves have a consistent cross-sectional area until they near the bottom wall, at which point the grooves deepen and their walls flare apart from each other. This flare 52 in the grooves helps to locate the leads of the bottom LED into the grooves as the second portion is pivoted toward the first portion (FIG. 3). The leads of a typical LED will normally be a consistent distance apart from each other and roughly straight. However, the leads can be bent in handling and are not reliably manufactured perfectly straight. Accordingly, the precise position of the leads extending from the bottom LED and out of the lower bores 40 is not well defined. The flares capture the bottom LED's leads in the grooves, even when the leads are not perfectly straight. As best shown in FIG. 3, the flares constitute bearing surfaces for the leads of the bottom LED, which bear against the bottom LED leads when the second portion is pivoted toward its closed position. The bottom edges of the lower bores 40 form the other bearing surfaces. While the second portion is being moved to the closed position, the flares slide along the bottom LED leads until the leads are held entirely by the grooves, as shown in FIG. 4, progressively bending the leads until they form a sharp 90° angle from the first portion and extend through the grooves in the second portion, directly out between the bottom surfaces of the first and second portions.

Similarly, the interior of the bores 44 in the second portion are bearing surfaces which bend the top LED's leads as the second portion is moved to its closed position. The bottom of the upper bores in the first portion form the other bearing surfaces so that when the second portion is closed, the leads of the top LED also have been bent to a sharp 90° angle and extend through the ends of the bores in the second portion. After the second portion has been closed against the first portion, the leads of both LEDs are predictably and securely located in the bores and grooves, respectively. The bores and grooves of the bottom surface 46 are positioned to be aligned with the holes in the printed circuit board in which the wire leads are to be mounted. This accordingly aligns the wires, greatly simplifying mounting the holder to a printed circuit board. With conventional LED holders, the leads can move significantly within the grooves around which they have been bent.

Figure 5:
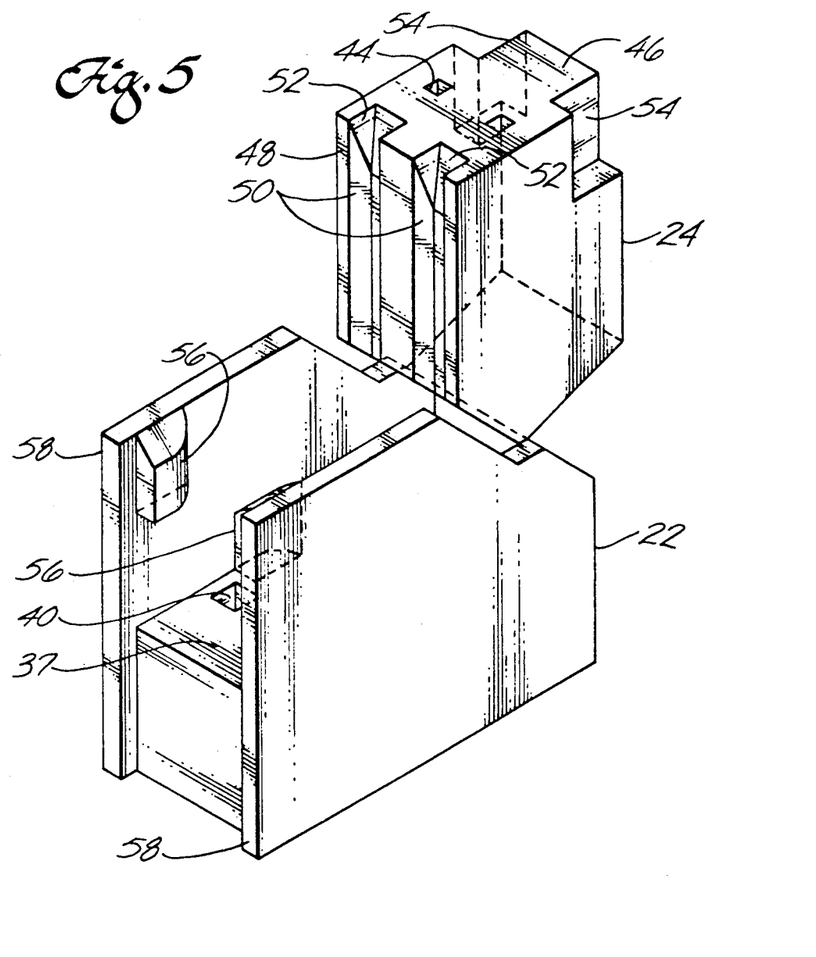
FIG. 5 is a perspective view of the holder of FIG. 2 in an open position with its front side pointed downward.
Figure 6:
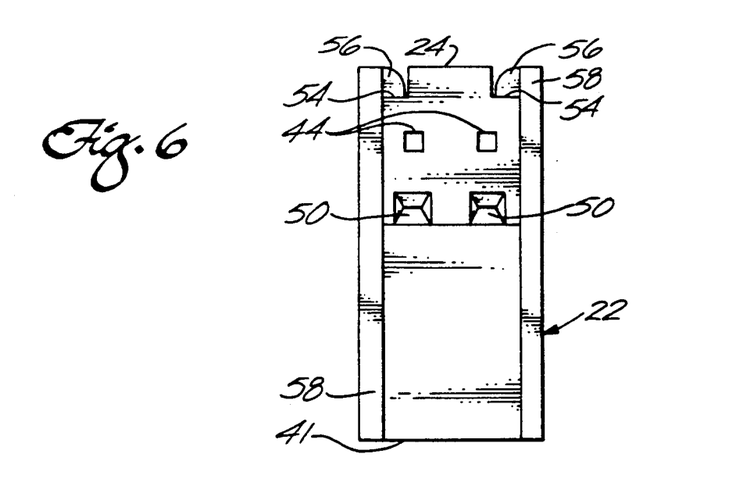
FIG. 6 is a bottom view of the holder of FIG. 2 in a closed position.

The holder also has a latch which retains the second portion in the closed position with respect to the first portion. The second portion has a pair of opposite shoulders 54 on either side which engage a pair of tabs 56 on the interior walls of the first portion (FIGS. 5, 6). As the second portion is pivoted toward the closed position, its outer walls bear against the tabs, pushing them apart from each other. When the second portion is pivoted far enough so that the shoulders pass below the tabs, the walls carrying the tabs bend back inward so that the tabs snap into place over the shoulders, holding the shoulders in place.

The bottom wall 41 of the first portion includes a pair of ridges 58 on opposite sides of the holes for the LED leads (FIGS. 5, 6). These ridges allow the printed circuit board to be flushed clean under the holder after all the soldering on the board has been completed, as is known in the art.

A pair of LEDs can be quickly and easily secured to a printed circuit board using the holder of FIGS. 1-7 without benefit of any special wire bending tools. First, the LEDs are inserted into the open holder. Holding the top LED 12 by its domed end, its leads are inserted into the top receptacle 30, into the top pair of bores 38 in the first portion, and then into the bores 44 in the second portion. The top LED is pushed into the receptacle until its flat end surface rests against the bottom 34 of the receptacle so that the ribs 42 hold it firmly in place. The bottom LED is then inserted into the bottom receptacle 32 by pushing its leads through the bottom bores 40 until the LED seats against the bottom 36 of the receptacle. The LEDs are then both in the position shown in FIG. 2. Next, the second portion is pivoted toward the second wall of the first portion, as shown in FIG. 3. Normally, the flares 52 will catch the respective leads of the bottom LED, bending the leads and guiding them toward their respective groove. If the leads of the bottom LED are severely bent, they can be assisted into the flares by hand. The second portion is then further pivoted until the leads are bent completely and the second portion latches into place against the first portion. Finally, the leads are cut, inserted into corresponding holes in a printed circuit board, and soldered into place using conventional techniques.

Figure 8:
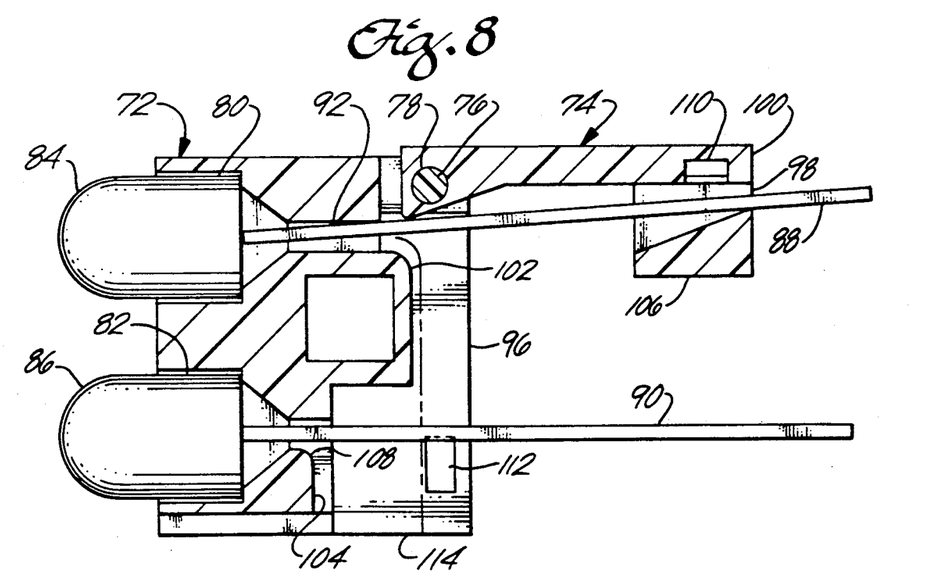
FIG. 8 is a side cross-sectional view of a second embodiment of an LED holder, according to the present invention, in an open position and containing LEDs.
Figure 9:
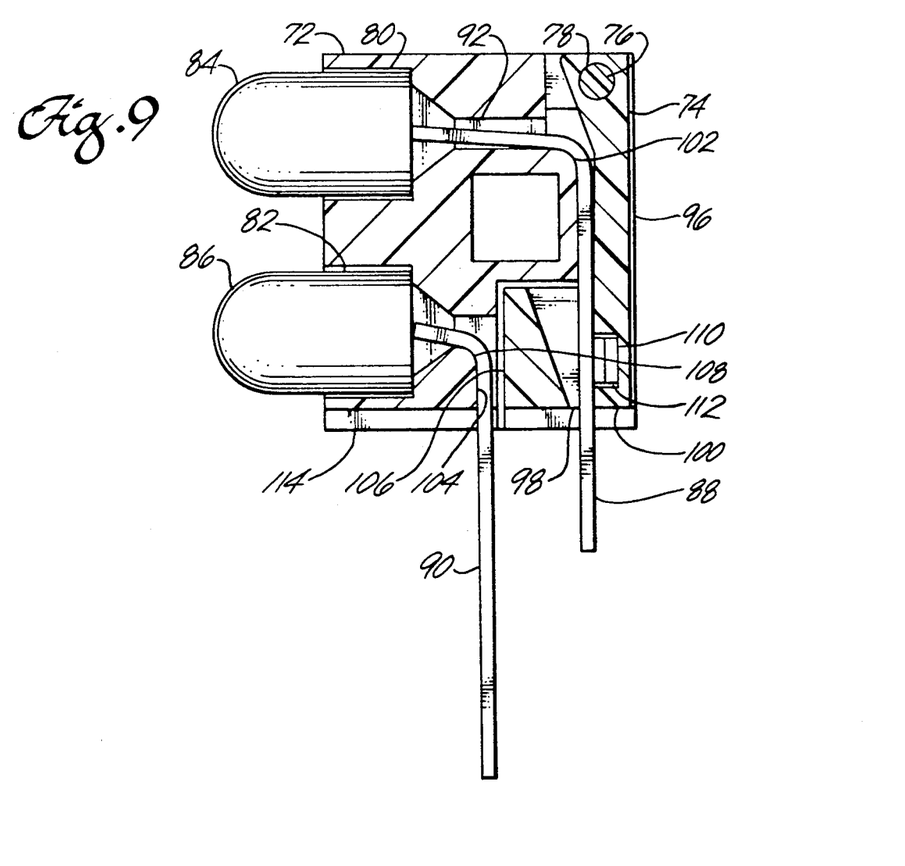
FIG. 9 is a side cross-sectional view of the LED holder of FIG. 8 in the closed position and containing LEDs.
Figure 10:
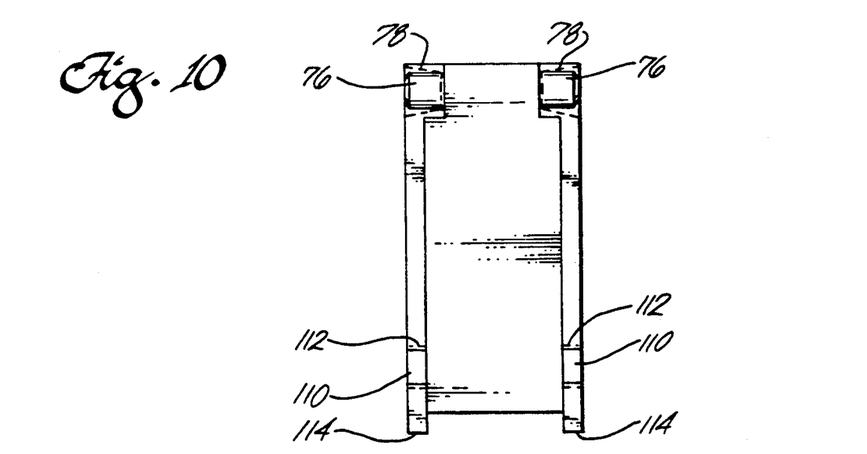
FIG. 10 is a rear view of the LED holder of FIG. 8 in the closed position.

A second embodiment of an LED holder 70, constructed according to the present invention, is depicted in FIGS. 8 through 10. This embodiment has a first portion 72, and a second portion 74 pivotably connected to the first portion. The second portion has a pair of hinge pins 76 which extend into holes 78 in the first portion. For some kinds of materials and for some dimensions of material, a flexible, thin, integral hinge, such as that shown in the embodiment of FIGS. 1 through 6, is not feasible. In such cases, a hinge pin arrangement is preferred.

The first portion of the holder has receptacles 80, 82 for retaining an upper LED 84 and a lower LED 86. The LEDs are similar to those shown in FIGS. 1-4, and have leads 88, 90 which extend from their flat bottom surfaces. A pair of bores 92, 94 extend from the bottom of each LED receptacle through the first portion to a second side wall 96. The bores flare out at the bottom of each receptacle to allow the LED leads to be more easily inserted into the bores. The second portion 74 includes a pair of upper bores 98 which are aligned with the upper bores 92 of the first portion when the second portion is in its open position. The bores in the second portion extend through the second portion to a bottom wall 100. As with the first embodiment, the upper bores have a greater cross-sectional area proximate the first portion than at the bottom wall.

Both the upper and lower pairs of bores in the first portion have curved lower interior walls 102, 104. These curved walls function as dies against which the leads are bent as the second portion is pivoted to its closed position. The bores in the second surface, having captured the upper leads, slide along the upper leads as the second portion is pivoted toward the first portion. The upper surface of the upper bores form bearing surfaces which force the leads to bend. As the leads bend, they are forced against the curved interior wall 102 of the upper bores so that when the second portion has been moved to its closed position, the leads curve around the curved walls and extends out through the bores in the second portion, as shown in FIG. 9.

The second portion has a side wall or guide wall 106 which is substantially flat. As the second portion is pivoted toward the first portion, this side wall butts against the leads of the lower LED, bearing against the leads and forcing them to bend around the curved interior wall of the lower bore. A pair of grooves 108 in the first portion's side wall guide the leads as they are bent, and securely position the leads of the lower LED in place when the second portion is latched in place as shown in FIG. 9. As the flat surface or guide wall of the second portion is closed against these grooves, the grooves, together with the second portion, form a closed pair of bores through which the leads extend.

As with the first embodiment, the second embodiment includes a latch. In this case, a pair of tabs 110 extend from the second portion and engage recesses 112 in the first portion. As the second portion is pushed toward the first portion, the tabs push opposite walls of the first portion apart until they enter into the recesses, at which point the walls converge to enclose the tabs in the recesses, thereby locking the second portion into the closed position.

As with the first embodiment, a ridge 114 is provided on either side of the bottom surface of the LED holder to allow the printed circuit board to be flushed out after soldering has been completed. LEDs are mounted using essentially the same method as with the first embodiment. If the leads of the bottom LED are severely bent, they can be guided into the grooves 104 in the first portion by hand.

A great variety of other modifications may be made without departing from the spirit and scope of the present invention. A variety of different shaped LEDs can be accommodated by modifying the shape of the receptacles. Greater or larger numbers of leads can be accommodated by varying the numbers of grooves and bores. The holder may be constructed to accommodate a single LED, using the principles applied to either the upper or the lower LED in the disclosed embodiments. The angles shown in the FIGS. may be altered so that, for example, the LEDs are pitched at a 45° or other angle with respect to the printed circuit board. The LEDs or holder can be fastened to the printed circuit board in any manner, and not only by soldering. Alternatively, the LEDs or holder can be fastened to some other surface, not a printed circuit board. By disclosing only the embodiments discussed above, it is not intended to restrict the scope of protection to those embodiments.

What is claimed is:

1. A holder for supporting on a surface two LEDs each having a pair of wire leads comprising:
    a first portion having
        a bottom surface for supporting the holder on the surface,
        a side wall having receptacle means for receiving first and second LEDs having a first pair and a second pair of leads, respectively,
        a second side wall opposite the first side wall, and
        means between the receptacle means and the second side wall for receiving the first and second pairs of leads and allowing the leads to extend past the second side wall; and
    a second portion, pivotably connected to the first portion, having means for receiving the first pair of leads and maintaining them separate from each other and a bearing surface for contacting the second pair of leads and maintaining them separate from the first pair of leads, wherein the means for receiving the first pair of leads and the bearing surface are adapted for bending the first and second pairs of leads to extend substantially perpendicular to the first portion bottom surface in response to pivoting the second portion toward the first portion.

2. Holder of claim 1 wherein the second portion is pivotable between an open position and a closed position, the closed position being closest to the first portion, the holder comprising means for retaining the second portion in the closed position.

3. Holder of claim 1 wherein the means for receiving the first pair of leads comprises two bores through the second portion for separately receiving each one of the first pair of leads.

4. Holder of claim 1 wherein the bearing surface comprises two grooves in the second portion for separately receiving each one of the second pair of leads.

5. Holder of claim 1 wherein the first portion further comprises two grooves on the second side wall for separately receiving each one of the second pair of leads when the second portion is in the closed position.

6. Holder of claim 1 wherein the receptacle means comprises first and second receptacles disposed in parallel for receiving the first and second LEDs, respectively, with the first LED being disposed parallel to the bottom surface and the second LED being disposed directly between the first LED and the bottom surface.

7. Holder of claim 3 wherein the two bores are parallel to each other, and the bearing surface and first portion second side wall cooperate for holding the second pair of leads parallel to each other, and parallel to the first pair of leads when the second portion is in the closed position.

8. A method for mounting first and second LEDs having first and second pairs of wire leads in an LED holder for supporting the LEDs on a surface comprising:

inserting each pair of the first and second pairs of wire leads into respective LED receptacles in a first portion of the holder and through respective bores in the holder to extend past the end of the bores until each LED seats in each receptacle;

inserting the extending first pair of leads through a second portion of the LED holder;

pivoting the second portion of the LED holder such that a bearing surface thereof pivots toward the extending second pair of leads to bend the first and second pairs of lead with respect to the bores; and further pivoting the second portion of the holder until it is engaged by a latch for holding the second portion in place, and the engaged second portion substantially holds the first and second pairs of leads in place.

9. Method of claim 8 wherein the bearing surface comprises a pair of grooves in a side wall of the second portion.

10. A method for mounting first and second LEDs having first and second pairs of wire leads respectively, in an LED holder for supporting the LEDs on a surface comprising:

inserting the first and second pairs of LED leads into respective LED receptacles in a first portion of the holder, through first and second bores, respectively, formed in the first portion of the holder, and further inserting the first pair of leads through a pair of third bores in a second portion of the LED holder and extending the second pair of leads towards a bearing surface of the second portion, until each LED seats in each respective receptacle;

pivoting the second portion of the holder with respect to the first portion to bend the first and second pairs of leads with respect to the first and second bores; and further pivoting the second portion of the holder until it is engaged with the first portion by a latch, and the engaged second portion substantially holds the first and second pairs of leads in place.

11. Method of claim 10 wherein the step of pivoting the second portion to bend the leads comprises pushing the bearing surface of the second portion against the second pair of leads so as to bend the leads about a bearing surface of the first portion.

12. A holder for supporting on a surface a pair of LEDs each having a pair of wire leads comprising:

a first portion having a bottom wall for supporting the holder on the surface, a side wall having first and second receptacles for receiving first and second LEDs, respectively, a second side wall opposite the receptacles for guiding first and second pairs of leads from the first and second LEDs, respectively, toward the bottom surface, and means extending between the receptacles and the second side wall for receiving the first and second pairs of leads and allowing the leads to extend past the second side wall; and a second portion pivotable connected to the first portion between an open position and a closed position having a bottom wall for supporting the holder, the bottom wall being adjacent the first portion bottom wall when the second portion is closed, and a guide wall for bending the second pair of leads toward the first portion second side wall upon closing the second portion so that the second pair of leads extends between the first and second bottom walls, and means receiving the first pair of leads for bending the first pair of leads toward the first portion second side wall upon closing the second portion.

13. Holder of claim 12 wherein the guide wall comprises a pair of recesses for capturing the second pair of leads as the second portion is closed and guiding the leads toward the first portion second side wall.

14. Holder of claim 12 wherein the guide wall comprises a pair of grooves for receiving and retaining the second pair of leads when the second portion is closed.

15. Holder of claim 11 wherein the first portion's second side wall has grooves for receiving and cooperating with the guide wall for retaining the second pair of leads when the second portion is closed.

16. Holder of claim 11 comprising a latch for retaining the second portion in the closed position, wherein the latch comprises opposing shoulders on the second portion proximate the bottom wall and opposing tabs on the first portion for engaging the shoulders, the tabs and shoulders being press fit due to inherent resiliency of the first portion.

17. Holder of claim 12 wherein the first and second portions are molded as an integral unit having a thin strip of flexible material interconnecting them.

18. Holder of claim 12 wherein one of the portions comprises opposing pins and the other one of the portions comprises opposing receptacles for receiving the pins, the pins pivotably connecting the pin carrying portion to the receptacles of the other portion.

19. Holder of claim 12 wherein the means receiving the first pair of leads and the guide wall and first portion second side wall are adapted for cooperatively holding the second pair of leads parallel to the first pair of leads when the second portion is closed.

20. Holder of claim 12 wherein the first and second receptacles are disposed in parallel with the first LED being disposed parallel to the bottom wall and the second LED being disposed between the first LED and the bottom wall.

21. A holder for supporting on a surface two LEDs each having a pair of wire leads comprising:

a first portion having a bottom wall for supporting the holder on the surface, a side wall having first and second receptacles for receiving first and second LEDs, respectively, a second side wall, and first means extending between the receptacles and the second side wall for receiving first and second pairs of leads from the first and second LEDs, respectively; and a second portion, pivotably connected to the first portion between an open and a closed position, having     a bottom wall for supporting the holder, the bottom wall being adjacent the first portion bottom wall when the second portion is closed,     a side wall facing and proximate the first portion side wall when the second portion is closed, and     second means extending between the side wall and the bottom wall for receiving the first and second pairs of leads, the second means being aligned with the first means in the first portion when the second portion is open and being adapted for bending the first and second pairs of leads as the second portion is closed.

22. Holder of claim 21 wherein the second means comprises two bores receiving the first pair of leads and two grooves receiving the second pair of leads.

23. Holder of claim 21 further comprising a latch for retaining the second portion in the closed position, wherein the latch comprises opposing shoulders on the second portion proximate the bottom wall and opposing tabs on the first portion for engaging the shoulders, the tabs and shoulders being press fit due to inherent resiliency of the first portion.

24. Holder of claim 21 wherein the first and second portions are molded as an integral unit having a thin strip of flexible material pivotably connecting them.

25. Holder of claim 21 wherein one of the portions comprises opposing pins and the other one of the portions comprises opposing receptacles for receiving the pins, the pins pivotably connecting the pin carrying portion to the receptacles.

26. Holder of claim 21 wherein the first and second receptacles are disposed in parallel with the first LED being disposed parallel to the bottom wall and the second LED being disposed between the first LED and the bottom wall.

27. Holder of claim 21 wherein the first means is adapted for cooperating with the first portion second side wall for holding the first and second pairs of leads in parallel to each other.

28. A holder for supporting on a surface an LED having a wire lead comprising:

a first portion having a bottom wall for supporting the holder on the surface,         a side wall having a receptacle for receiving the LED,         a second side wall opposite the receptacle for guiding the lead toward the bottom surface, and         a bore extending between the receptacle and the second side wall for receiving the lead and allowing the lead to extend past the second side wall; and     a second portion pivotably connected to the first portion between an open position and a closed position having         a bottom wall for supporting the holder, the bottom wall being adjacent the first portion bottom wall when the second portion is closed, and         a guide wall adapted to bend the lead toward the first surface seconds die wall upon closing the second portion so that the lead extends between the first and second bottom walls,     wherein the guide wall comprises a groove for receiving and retaining the lead when the second portion is closed, and the groove has side walls which flare out away from each other, proximate the bottom wall for capturing the lead and guiding it toward the groove.

29. A holder for supporting on a surface an LED having a wire lead comprising:

a first portion having a bottom wall for supporting the holder on the surface,         a side wall having a receptacle for receiving the LED,         a second side wall, and         a bore extending between the receptacle and the second side wall for receiving the lead; and     a second portion, pivotably connected to the first portion between an open and a closed position, having         a bottom wall for supporting the holder, the bottom wall being adjacent the first portion bottom wall when the second portion is closed,         a side wall facing and proximate the first surface side wall when the second portion is closed, and         a bore extending between the side wall and the bottom wall for receiving the lead, the bore being aligned with the first portion bore when the second portion is open and bending the lead as the second portion is closed,     wherein the cross-sectional area of the second portion bore increases proximate the side wall.

30. A holder for supporting on a surface an LED having a wire lead comprising:

a first portion having a bottom wall for supporting the holder on the surface,         a side wall having a receptacle for receiving the LED,         a second side wall, and         a bore extending between the receptacle and the second side wall for receiving the lead; and     a second portion, pivotably connected to the first portion between an open and a closed position, having         a bottom wall for supporting the holder, the bottom wall being adjacent the first portion bottom wall when the second portion is closed,         a side wall facing and proximate the first surface side wall when the second portion is closed, and         a bore extending between the side wall and the bottom wall for receiving the lead, the bore being aligned with the first portion bore when the second portion is open and bending the lead as the second portion is closed,     wherein the cross-sectional area of the second portion bore decreases proximate the bottom wall.

* * * * *

UNITED STATES PATENT AND TRADEMARK OFFICE
CERTIFICATE OF CORRECTION

PATENT NO. : 5,121,311
DATED : June 9, 1992
INVENTOR(S) : David A. Cheselske

It is certified that error appears in the above-identified patent and that said Letters Patent is hereby corrected as shown below:

On the Front Page:

[56] References Cited, U.S. PATENT DOCUMENTS, insert the following references:

```
-- 4,398,240  8/1983  Savage, Jr....262/311
   4,667,277  5/1987  Hanchar.......362/250
   4,908,743  3/1990  Miller........362/238 --.
```

In the Claims:

Column 8, line 5, change "pivotable" to -- pivotably --.

Column 8, line 28, change "claim 11" to -- claim 12 --.

Column 8, line 32, change "claim 11" to -- claim 12 --.

Column 10, line 2, change "seconds die" to -- second side --.

Signed and Sealed this

Twenty-fourth Day of August, 1993

Attest:

BRUCE LEHMAN

*Attesting Officer*     *Commissioner of Patents and Trademarks*